United States Patent
Tyagi et al.

(10) Patent No.: US 11,424,289 B2
(45) Date of Patent: *Aug. 23, 2022

(54) IN SITU SELECTIVE ETCHING AND SELECTIVE REGROWTH OF EPITAXIAL LAYER FOR SURFACE RECOMBINATION VELOCITY REDUCTION IN LIGHT EMITTING DIODES

(71) Applicant: Meta Platforms Technologies, LLC, Menlo Park, CA (US)

(72) Inventors: Anurag Tyagi, Kirkland, WA (US); James Ronald Bonar, Redmond, WA (US); Gareth Valentine, Kirkland, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/096,764

(22) Filed: Nov. 12, 2020

(65) Prior Publication Data

US 2021/0151498 A1    May 20, 2021

Related U.S. Application Data

(60) Provisional application No. 62/935,534, filed on Nov. 14, 2019.

(51) Int. Cl.
*H01L 27/15*        (2006.01)
(52) U.S. Cl.
CPC .................... *H01L 27/156* (2013.01)
(58) Field of Classification Search
CPC .... H01L 33/0062; H01L 33/06; H01L 27/156
See application file for complete search history.

(56) References Cited

U.S. PATENT DOCUMENTS

| | | | |
|---|---|---|---|
| 2016/0197232 A1* | 7/2016 | Bour | H01L 33/20 257/13 |
| 2018/0097145 A1 | 4/2018 | Bour et al. | |
| 2020/0313036 A1 | 10/2020 | Broell et al. | |

FOREIGN PATENT DOCUMENTS

| EP | 0549278 A1 | 6/1993 |
|---|---|---|
| EP | 0549278 B1 | 6/1993 |

(Continued)

OTHER PUBLICATIONS

PCT Application No. PCT/US2020/025762, "International Search Report and Written Opinion", dated Jun. 26, 2020, 12 pages.

(Continued)

*Primary Examiner* — Changhyun Yi
(74) *Attorney, Agent, or Firm* — Weaver Austin Villeneuve & Sampson LLP

(57) ABSTRACT

LED apparatuses featuring etched mesas and techniques for manufacturing LED apparatuses are described, including techniques for reducing surface recombination and techniques for charge carrier confinement. Etched facets of an LED mesa can be passivated using epitaxial regrowth of one or more semiconductor regrowth layers. The one or more semiconductor regrowth layers can include a transition layer. The transition layer can be configured with a bandgap energy between that of layers that are on opposite sides of the transition layer. A transition layer can separate an etched facet and another regrowth layer or separate two regrowth layers. In some instances, selective etching can be performed to preferentially etch a quantum well layer relative to a barrier layer. The selective etching removes surface imperfections, which contribute to surface recombination and which tend to be more prevalent in etched facets of the quantum well layer than etched facets of the barrier layer.

30 Claims, 11 Drawing Sheets

(56) References Cited

FOREIGN PATENT DOCUMENTS

| | | |
|---|---|---|
| EP | 2110904 A1 | 10/2009 |
| JP | 2011 114155 | 6/2011 |
| WO | 0045443 A1 | 8/2000 |
| WO | 2015099944 A1 | 7/2015 |
| WO | 2018005286 A1 | 1/2018 |
| WO | 2020205761 A1 | 10/2020 |

OTHER PUBLICATIONS

Carlos Angulo Barrios "Gallium arsenide based Buried Heterostructure Laser Diodes with Aluminium-free Semi-Insulating materials Regrowth" Laboratory of Semiconductor Materials Department of Microelectronics and Information Technology Royal Institute of Technology Electrum 229, S-164 40 Kista, Stockholm, Sweden, Sep./Oct. 2002, 109 pages.

International Search Report and Written Opinion for International Application No. PCT/US2020/060404, dated Mar. 1, 2021, 12 Pages.

Marcks Von Wutemberg R., et al., "A Novel Electrical and Optical Confinement Scheme for Surface Emitting Optoelectronic Devices," Proceedings of SPIE vol. 6350, Jul. 6, 2006, pp. 63500J1-63500J10, XP040230578.

* cited by examiner

IN SITU SELECTIVE ETCHING AND SELECTIVE REGROWTH OF EPITAXIAL LAYER FOR SURFACE RECOMBINATION VELOCITY REDUCTION IN LIGHT EMITTING DIODES

CROSS-REFERENCE TO RELATED APPLICATIONS

This application claims the benefit of U.S. Provisional Application No. 62/935,534, filed Nov. 14, 2019, entitled "IN SITU SELECTIVE ETCHING AND SELECTIVE REGROWTH OF EPITAXIAL LAYER FOR SURFACE RECOMBINATION VELOCITY REDUCTION IN LIGHT EMITTING DIODES," which is incorporated herein by reference in its entirety.

BACKGROUND

Aspects of the disclosure relate to the design of light emitting diodes (LEDs). As the physical size of LEDs is reduced, efficiency losses due to surface recombination become ever more significant as a factor impacting overall performance. Etching mesas from a layered epitaxial structure often results in etched mesa facets that include surface imperfections. Such undesired features tend to increase surface recombination velocity and induce dark current, driving down the light converting efficiency of the LEDs. Techniques that can address the surface recombination problem exhibited in etched mesas would improve LED efficiency.

SUMMARY

The present disclosure presents various embodiments in which regrowth of an epitaxial layer is used to passivate etched facets of an LED mesa, in a manner that provides an improved crystalline interface at the etched facets, to reduce dangling bonds and other surface imperfections. Doing so decreases current flow that is lost to non-radiative recombination associated with surface states, i.e., at or near the etched facets of the LED mesa. In certain aspects, one or more regrowth semiconductor layers are formed over etched facets. The etched facets over which the regrowth semiconductor layer(s) are formed may include facets of: one or more quantum well layers, one or more barrier layers, and/or one or more semiconductor layers. Optionally, one or more transition layers can be formed between the etched facets and a regrowth semiconductor layer and/or between regrowth semiconductor layers. Optionally, the one or more regrowth semiconductor layers can be doped to confine charge carriers to the quantum well layer.

Various doping configurations of regrowth semiconductor layers are described. Optionally, a selective etching process can be applied to preferentially etch a quantum well layer faster than an adjacent barrier layer. The selective etching process exposes new facets of the quantum well layer that have fewer surface imperfections and can be performed prior to regrowth. In certain aspects, an LED array apparatus includes a plurality of mesas etched from a layered epitaxial structure, and one or more regrowth semiconductor layers. The layered epitaxial structure includes a quantum well layer etched according to a first etch rate and a barrier layer etched according to a second etch rate. The barrier layer is positioned adjacent to the quantum well layer. The first etch rate is greater than the second etch rate such that along etched facets of the plurality of mesas, areas of undercutting are formed in the quantum well layer as a result of etching to a greater depth compared to the barrier layer. The one or more regrowth semiconductor layers include a first regrowth semiconductor layer, grown epitaxially over the etched facets of the plurality of mesas. For each mesa, the first regrowth semiconductor layer overlays the quantum well layer and the barrier layer.

In certain aspects, an LED array apparatus includes a plurality of mesas etched from a layered epitaxial structure. The layered epitaxial structure includes a P-type doped semiconductor layer, a quantum well layer, and an N-type doped semiconductor layer. The LED array apparatus further includes one or more regrowth semiconductor layers, including a first regrowth semiconductor layer, grown epitaxially over etched facets of the plurality of mesas. For each mesa, the first regrowth semiconductor layer overlays the P-type doped semiconductor layer, the quantum well layer, and the N-type doped semiconductor layer, around an entire perimeter of the mesa.

In certain aspects, a method for forming a layered epitaxial structure including a P-type doped semiconductor layer, a quantum well layer, and an N-type doped semiconductor layer involves etching the layered epitaxial structure to form a plurality of mesas. The etching exposes etched facets of the plurality of mesas. The method further involves epitaxially growing one or more regrowth semiconductor layers, including a first regrowth semiconductor layer, over the etched facets of the plurality of mesas. For each mesa, the first regrowth semiconductor layer overlays the P-type doped semiconductor layer, the quantum well layer, and the N-type doped semiconductor layer, around an entire perimeter of the mesa.

BRIEF DESCRIPTION OF THE DRAWINGS

Aspects of the disclosure are illustrated by way of example.

DETAILED DESCRIPTION

The disclosure presents various embodiments in which regrowth of an epitaxial layer is used to passivate etched facets of an LED mesa, in a manner that provides an improved crystalline interface at the etched facets, to reduce dangling bonds and other surface imperfections. Doing so decreases current flow that is lost to non-radiative recombination associated with surface states, i.e., at or near the etched facets of the LED mesa. In other words, surface recombination velocity can be significantly reduced, and efficiency losses of the LED due to surface recombination can be greatly mitigated.

Figure 3A:
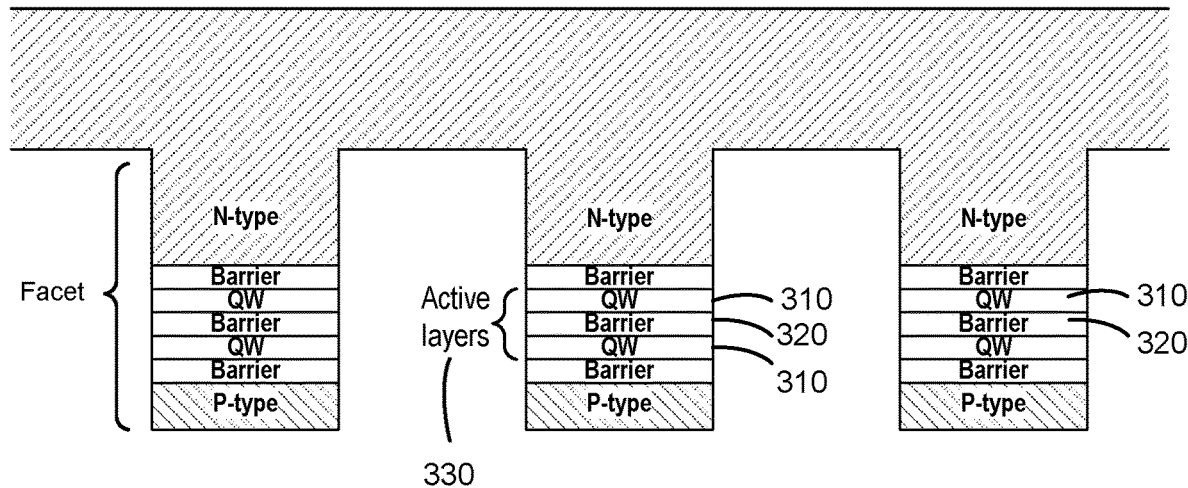
FIG. 3A illustrates a plurality of mesas having active layers.

Aspects of the present disclosure relate to LED structures that include quantum wells and barriers as part of a layered epitaxial structure etched to form one or more LEDs. As used herein, the term "quantum well layer" or "QW layer" refers to any layer that includes at least one quantum well. A quantum well layer that includes two or more quantum wells (possibly separated by intervening layers such as barriers, as shown in FIG. 3A) is referred to herein as a "multiple quantum wells layer" or "MQW layer." Similarly, as used herein, the term "barrier layer" refers to any layer than includes at least one barrier. For instance, a barrier layer can include a first barrier material on top of a second barrier material.

Embodiments of the disclosure may include or be implemented in conjunction with an artificial reality system having a display that incorporates an LED structure as described herein. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 1:
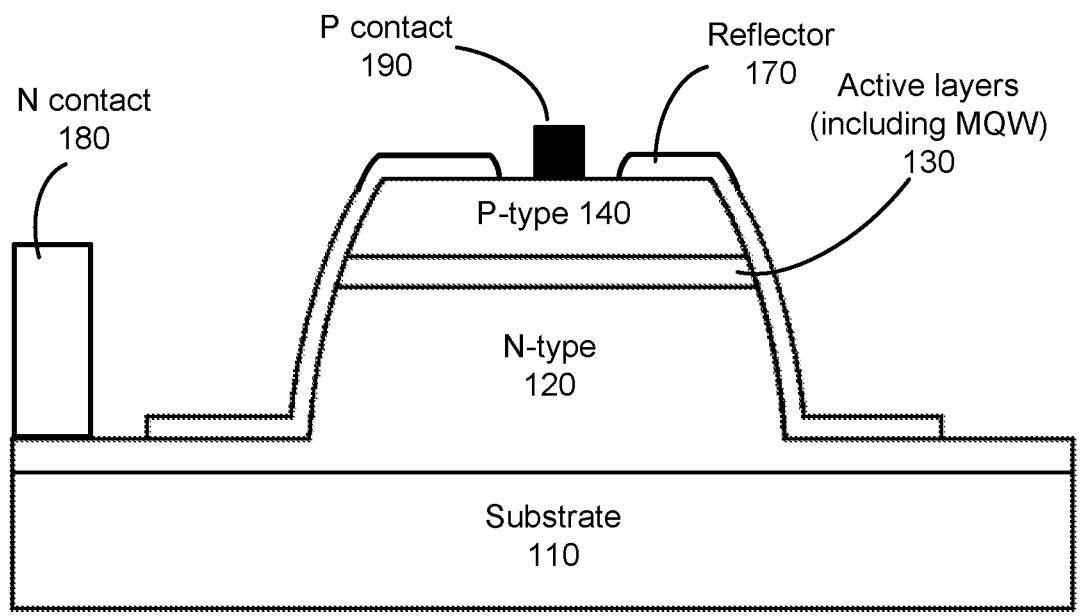
FIG. 1 illustrates a simplified diagram showing the basic components of an etched parabolic mesa configured as an LED.

FIG. 1 illustrates an example of an LED 100 including a parabolic mesa structure. According to embodiments of the disclosure, LED 100 emits incoherent light. LED 100 may be a micro-LED having a lateral dimension, or diameter, of less than 10 micrometers. LED 100 may be made of inorganic materials, such as multiple layers of semiconductor materials. For example, the layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb).

The layered semiconductor device may be manufactured by growing multiple epitaxial layers on a substrate, in one or more chambers, using techniques such as molecular beam epitaxy (MBE), metalorganic vapor-phase epitaxy (MOVPE), also known as organometallic vapor-phase epitaxy (OMVPE) or metalorganic chemical vapor deposition (MOCVD), or physical vapor deposition (PVD), such as pulsed laser deposition (PLD). For example, the semiconductor layers may be grown layer-by-layer on a substrate with a certain crystal lattice orientation, such as a sapphire, quartz, gallium nitride (GaN), gallium arsenide (GaAs), gallium phosphide (GaP). The silicon substrate may be cut in a specific direction to expose a specific plane as the growth surface.

LED 100 may include a substrate layer 110, which may include, for example, an aluminum oxide ($Al_2O_3$) substrate ("sapphire" substrate) or a GaN substrate. A semiconductor layer 120 may be grown on substrate layer 110. Semiconductor layer 120 may include a Group III-V material, such as GaN, and may be p-doped (e.g., with Mg, Ca, Zn, or Be) or n-doped (e.g., with Si or Ge). In the example shown in FIG. 1, layer 120 is an N-type doped semiconductor material. One or more active layers 130 may be grown on semiconductor layer 120. Active layers 130 may include one or more indium gallium nitride (InGaN) layers, one or more aluminum indium gallium phosphide (AlInGaP) layers, or one or more GaN layers, which may form one or more heterostructures, such as one or more quantum wells. Here, active layers 130 comprise a multiple quantum wells (MQW) layer including two or more quantum wells. However, in some embodiments, an LED may include only one quantum well. A semiconductor layer 140 may be grown on active layers 130. Semiconductor layer 140 may include a III-V material, such as GaN, and may be p-doped (e.g., with Mg, Ca, Zn, or Be) or n-doped (e.g., with Si or Ge). In the example shown in FIG. 1, layer 140 is a P-type doped semiconductor material. Semiconductor layer 120 and semiconductor layer 140 sandwich active layers 130 to form the light emitting diode. For example, LED 100 may include a layer of InGaN situated between a layer of p-type GaN doped with magnesium and a layer of n-type GaN doped with silicon or oxygen. In some embodiments, LED 100 may include a layer of AlInGaP situated between a layer of p-type AlInGaP doped with zinc or magnesium and a layer of n-type AlInGaP doped with selenium, silicon, or tellurium.

To make contact with semiconductor layer 120 (e.g., an n-GaN layer) of the diode and to more efficiently extract light emitted by active layers 130 from LED 100, the semiconductor layers may be etched to expose semiconductor layer 120 and form a mesa structure that include layers 120-140. The mesa structure may confine carriers within the injection area of the device. Etching the mesa structure may lead to the formation of mesa side walls—also referred to herein as facets—that may be non-parallel with, or in some cases, orthogonal, to the growth planes. A reflective layer 170 may be formed on the side walls of the mesa structure. Reflective layer 170 may include an oxide layer, such as a silicon oxide ($SiO_2$) layer, and may act as a reflector to reflect emitted light out of LED 400. A contact 180, which may comprise a metal, such as Al, Au, Ni, Ti, or any combination thereof, or a non-metal conductive material, shown as a N contact in this figure, may be formed on semiconductor layer 120 and may act as an electrode of LED 100. In addition, another contact 190, such as an Al/Ni/Au metal layer, shown as a P-contact in this figure, may be formed to make ohmic contact with semiconductor layer 140 to act as another electrode of LED 100.

When a voltage signal is applied to contact layers 180 and 190, electrons and holes may recombine in active layers 430, where the recombination of electrons and holes may cause photon emission. The wavelength and energy of the emitted photons may depend on the energy bandgap between the valence band and the conduction band in active layers 130. For example, InGaN active layers may emit green or blue light, while AlInGaP active layers may emit red, orange, yellow, or green light. The emitted photons may be reflected by reflective layer 170 and may exit LED 100, for example, from the bottom side (e.g., substrate 110) shown in FIG. 1.

In some embodiments, the LED 100 may include a mesa of another shape, such as a planar, vertical, conical, semi-parabolic, or parabolic shape, where a base area of the mesa may be circular, rectangular, hexagonal, or triangular. For example, the LED may include a mesa of a curved shape (e.g., paraboloid shape) and non-curved shape (e.g., conic shape). The mesa may be truncated or non-truncated.

Figure 2A:
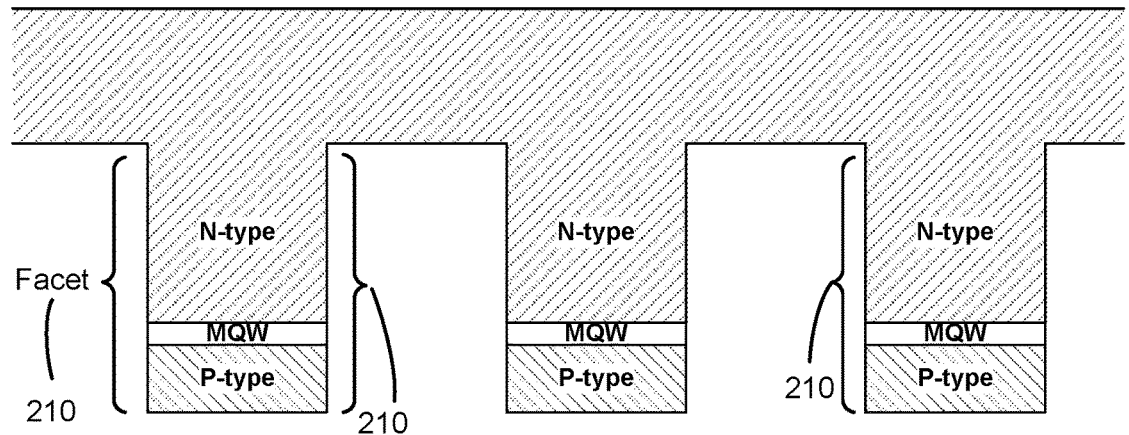
FIG. 2A illustrates a plurality of vertical mesas.

FIG. 2A illustrates a plurality of vertical mesas. In contrast to the parabolic shape of the mesa shown in FIG. 1, the mesas shown in FIG. 2A have vertically oriented side walls, or facets. The orientation of the mesas has also been flipped in FIG. 2A compared to FIG. 1. Here, light from each LED exits the mesa structure from the "top" side of the figure. Components such as P-contacts, N-contact, reflector layers, etc. are not explicitly shown for ease of illustration. The plurality of mesas shown in FIG. 2A may form an array of LEDs that contribute light for a display. For example, light for each mesa may contribute light for one pixel, or one color of a pixel, of a display.

While FIG. 2A presents a cross-sectional view, the array of mesas may comprise a two-dimensional array of mesas, each corresponding to an LED device. As mentioned previously, each LED may have a lateral dimension, or diameter, of less than 10 micrometers. From a plan view, or top-down view, the void or trench between two adjacent mesas may be in the range of 0.05 to 7 micrometers, according to various embodiments. This supports a wide range of pitch distances, i.e., the center-to-center distance between two adjacent mesas. The number of mesas included in an array may vary. In various embodiments, the number of mesas along a first dimension may be in the thousands, and the number of mesas along a second dimension may also be in the thousands. Just as an example, an array may comprise 1,500 mesas by 1,000 mesas. In another example, an array may comprise 2,000 mesas by 1,500 mesas.

Figure 2B:
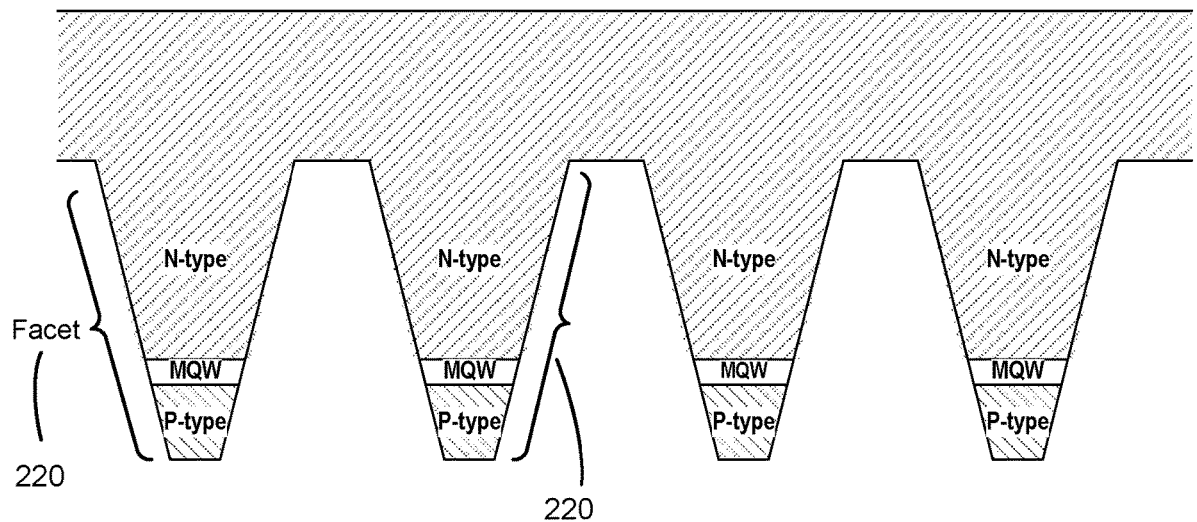
FIG. 2B illustrates a plurality of mesas having a trapezoidal profile.

While FIG. 2A illustrates an example of vertical mesas associated with cylindrical three-dimensional shapes, other shapes are possible. Just as an example, FIG. 2B illustrates a plurality of mesas having a trapezoidal profile, and therefore slanted facets 220. Other types of mesas are also possible, including those having more complex profiles such as a combination of shapes, such as a combination of rectangular and a trapezoidal profile(s). Use of regrowth semiconductor layers on the facet of mesas to reduce non-radiative recombination may be adopted for mesas of different shapes and profiles, according to various embodiments of the disclosure.

Surface imperfections on the facets of each mesa may contribute to undesirable surface recombination that decreases the efficiency of each LED. At the mesa facets, the atomic lattice structure of the N-type doped semiconductor material, light emitting material, and P-type doped semiconductor material comes to an abrupt end. At these surfaces, atoms of the semiconductor material lack neighbors to which bonds may be attached. This results in "dangling bonds," which are characterized by unpaired valence electrons. These dangling bonds create energy levels within the bandgap of the semiconductor material that otherwise would not exist, causing non-radiative electron-hole recombination at or near the surface of the semiconductor material. A measure of the ease with which such recombination occurs is the surface recombination velocity (SRV). Increased SRV is thus associated with non-radiative recombination, i.e., recombination of electrons and holes without producing photons, which reduces the efficiency of the LED.

The effects of non-radiative recombination are especially pronounced as the physical size of each mesas is reduced to diameters of 10 micrometers and below, and more specifically, to 5 microns and below. In larger LED devices, e.g., diameters greater than 50 micrometers, the LED regions affected by surface recombination is proportionally small. For example, assuming a diffusion length of 1 micrometer, the effects of surface recombination may be limited to those areas within approximately 1 micrometer of the mesa facets. For a device having a diameter of 50 micrometers, only a small fraction of the interior of the device is within 1 micrometer of the device surface—i.e., mesa facet. The region of the device affected by surface recombination does not add up to a significant portion of span of the multiple quantum wells (MQW) layer. In other words, desirable, radiative recombination (which release photons) at the MQW layer dominate the percentage of overall occurrences of recombination for the LED device. By contrast, for a device having a very small physical size, e.g., 2 micrometers in diameter, the region affected by surface recombination, assuming a diffusion length of 1 micrometer, may be quite significant. In such a case, a large percentage of the overall occurrences of recombination may be impacted by effects of non-radiative surface recombination near the mesa facets. Thus, the potential for efficiency degradation is especially acute for micro-LEDs.

To exacerbate the problem, LEDs generally cannot be operated at current densities high enough to circumvent the problems associated with high surface recombination velocity. The diffusion length of a given material may vary depending on the current density at which the device is operated. A higher current density (e.g., in units of amps/$cm^2$) is associated with lower surface recombination velocity. Theoretically, surface recombination velocity can be reduced by increasing current density. For example, a laser device may be operated at a high current density, e.g., in the Kamps/$cm^2$ range, to drive down surface recombination velocity. By contrast, an LED device generally cannot be operated at such high current densities. Instead, LED devices typically operate in the range of 1-100 amps/cm². As such, operation at very high current densities may not be feasible, and the need is even greater for alternative strategies for reducing surface recombination velocity in LED devices. According to various embodiments of the present disclosure, one or more regrowth semiconductor layers on the facets of micro-LEDs may be used to reduce surface recombination velocity and significantly improve LED efficiency. In some embodiments, the facets of micro-LEDs may require selective etching prior to regrowth of the semiconductor layers to further facilitate a reduction in surface recombination velocity.

Active layers within an LED may be particularly sensitive to surface imperfections on the facets. This may be due, in part, to the fact that a larger proportion of surface combination occurs within the MQW layers of the active layers. FIG. 3A illustrates a plurality of vertical mesas, similar to those in FIGS. 2A and 2B in material and function, having active layers. Active layers 330 in the vertical mesas may be similar to the active layers 130 in material and function, and contain multiple quantum wells. The active layers as depicted in FIG. 3A may contain a plurality of quantum well (QW) layers 310 and one or more barrier layers 320. Each QW layer 310 can include one or more of the following: indium gallium nitride (InGaN), indium gallium phosphide (AlInGaP), indium gallium phosphide (InGaP), gallium arsenide phosphide (GaAsP), or gallium nitride (GaN). The barrier layers 320 may be gallium nitride (GaN), aluminum gallium nitride (AlGaN), indium gallium nitride (InGaN), or aluminum gallium indium nitride (AlGaInN) barriers. For example, each of the barrier layers may be an InGaN barrier with approximately 0.01-0.04 Indium alloy mole fraction (e.g., $In_{0.02}Ga_{0.98}N$). In some embodiments, hybrid barriers may be used for the barrier layers (e.g., an ~1 nm thick AlGaN barrier followed by an ~2-15 nm thick GaN barrier together in one barrier layer). Similarly, a QW layer 310 can include quantum wells formed using different materials selected from the list above. Optionally, the barrier layers 320 can include AlInGaP barriers. Other suitable materials for the barrier layers 320 include, for example, aluminum indium phosphide (AlInP), aluminum gallium arsenide (AlGaAs) or aluminum indium gallium arsenide phosphide (AlInGaAsP).

Figure 3B:
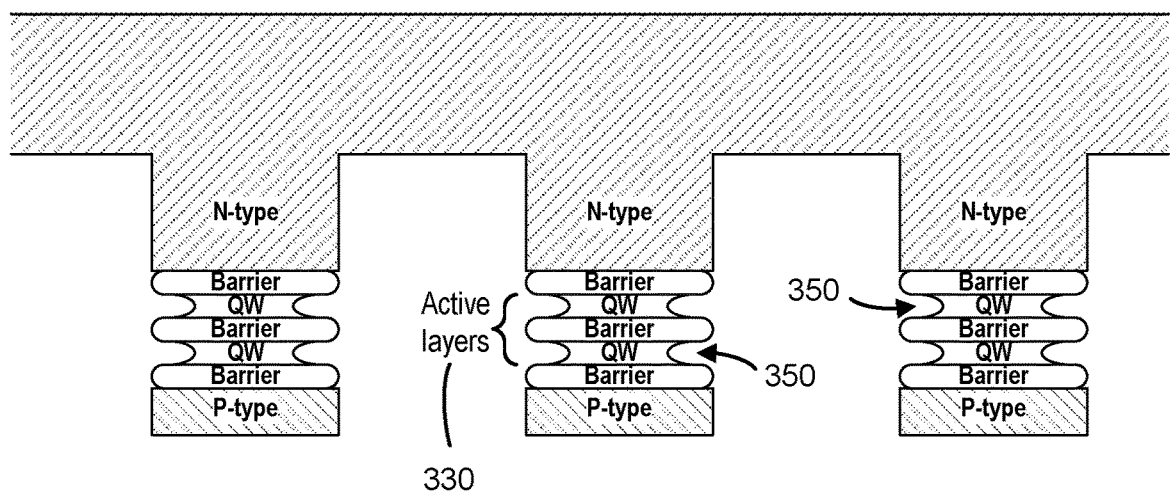
FIG. 3B illustrates active layers that have been selectively etched, according to an embodiment of the disclosure.

In some embodiments, such as those depicted in FIGS. 3A and 3B, a barrier layer may be sandwiched in between two QW layers. In various embodiments, there may be more than two QW layers and/or more than one barrier layer. For example, there may be from 1 to 20 QW layers, preferably from 1 to 10 QW layers, and/or from 1 to 20 barrier layers, preferably from 1 to 10 barrier layers. Further, as shown in FIGS. 3A and 3B, active layers can be arranged such that successive layers alternate between barrier layers and quantum well layers.

Surface imperfections may be more prevalent along the QW layers exposed by the facets of each mesa as compared to the barrier layers. For example, 90% of the surface imperfections along the facets for the active layers may be present in the QW layers, while only 10% are present in the barrier layers, for a given active layer. Moreover, the effects of the surface imperfections within the QW layers may be more severe than in other areas since QW layers are more prone to surface recombination. Thus, addressing the surface imperfections within the QW layers may reduce the surface recombination velocity of a given mesa.

Surface imperfections within the QW layers may be addressed through a combination of top-down selective etching and bottom-up selective area growth based approaches. That is, surface imperfections within the QW layers may be selectively etched to reveal crystallographic facets, for example, in the m-plane, and then "healed" by selective-regrowth over the facets.

According to various embodiments of the present disclosure, the QW layers of the micro-LEDs may be subjected to a chemically selective etching process to remove the surface imperfections and reveal crystallographically stable "natural" facets. The stable "natural" facets may lower surface recombination due to having fewer unpaired valence electrons. During a chemically selective etching process the QW layers may etch at a faster rate than other exposed material, such as the barrier layers. For example, the QW layers may etch at a rate of approximately 0.1 nm/sec or the QW layers may etch at a rate that is 2-5 times faster than the rate that the barrier layer etches.

The QW layers may be preferentially etched in part due to the differences in thermodynamic and/or surface kinetic properties of the QW layers as compared to the barrier layers. In addition, differences in the mass transport (e.g., via surface diffusion) properties of the QW layers with respect to the barrier layers may be exploited to create desired material composition and sidewall profiles. In some cases, the QW layers may be modified via competing processes of deposition and desorption. The material composition of the QW layers may be less stable than the barrier layers. The QW layers being less stable allows the QW layers to be preferentially etched. For example, in some embodiments the QW layers may include InGaN while the barrier layers include GaN or AlGaN. In such cases, the QW layers including InGaN may etch at a faster rate than the barrier layers including GaN or AlGaN. In some embodiments, the chemically selective etching process may include exposing the vertical mesas to high temperatures (at or greater than 400° C., preferably at or greater than 550° C.). The lateral etch rate, selectivity, and mass transport properties of the QW layers can be modified by adjusting one or more process conditions, independently or in conjunction. Exemplary process conditions that can be modified include group-V partial pressures, V/III partial pressure ratio, the carrier gas (e.g., Ar, $H_2$ or $N_2$) flow rate, temperature ramping and cycling, gas flow pulsing, intentionally introducing other vapor phase etchants (e.g., HCl, HF, $XeF_2$). In such cases, the QW layers etch at a faster rate while the barrier layers remain intact or etch at a slower rate. In this manner, the surface imperfections along the facets exposing the QW layers may be removed while leaving the barrier layers intact or substantially intact. In some embodiments, the N-type semiconductor layers and/or the P-type semiconductor layers adjacent to the active layers may also be etched during the selective etching process.

FIG. 3B illustrates the QW layers 310 after being selectively etched, according to an embodiment of the disclosure. As shown in FIGS. 3A and 3B, in some embodiments, the selective etching of QW layers may be performed after forming vertical mesas with exposed facets. During the selective etching, the QW layers may be etched at a faster rate than the barrier layers. This may result in the QW layers being etched more in the lateral direction than the barrier layers. By etching the QW layers at a faster rate than the barrier layers, surface imperfections along the facets of the QW layers may be removed. Selectively etching the QW layers may allow for the surface imperfections to be removed both along the growth direction and the lateral direction. Because, as noted above, surface recombination is more prevalent along facets of the QW layers than the facets of the barrier layers, etching the QW layers preferentially may allow for surface detects to be removed more efficiently and reduce surface recombination.

Selectively etching the QW layers may form areas 350 of undercutting in which the QW layers are etched further in the lateral direction than the barrier layers. This may result in the barrier layers overhanging the QW layers. To address the surface imperfections within the QW layers approximately from 0.01 to 25% of the QW layer may be etched in the lateral direction from each side. In other words, a given QW layer may be undercut by up to 25% on each side with relation to the barrier layers, resulting in a total undercut for the given QW layer of 50%. Just as an example, each QW layer may have a lateral area footprint of 1 µm by 1 µm. Thus, in this example, after a chemically selective etching process, a given QW layer may have a reduced lateral area footprint of up to 850 nm by 850 nm. In some cases, the amount of QW layer etched is quantified by the amount of "remaining" material in the QW layers. In such cases, more than 50 nm of QW layers may remain after a selective etching process. Etching the QW layers too far may be undesirable because it may lead to too much undercutting of the barrier layers. If the QW layers are etched too far in the lateral direction, then there is nothing supporting the barrier layers sandwiched between the QW layers. Thus, too much undercutting may lead to mechanical instability of the mesa structures, in particular the active layers.

In some embodiments, the QW layers may be asymmetrically etched. The symmetry of the selective etch process may depend on the resulting application of the LEDs. Asymmetrical etching of the QW layers may be desirable for applications requiring chief ray engineering. For example, controlling the angle of the light as it enters the wave guide may be done through asymmetrical etching. By etching one side of the QW layers to a greater lateral depth than another side may act to focus or disperse light emitting from the QW layers, depending on the symmetry of the etch. In some embodiments, all of the QW layers within a given LED array may have the same symmetry or asymmetry. However, in other embodiments, the symmetry or asymmetry of an LED's QW layers may vary within an LED array.

Asymmetrical etching may also be done for manufacturing and assembly reasons. For example, asymmetrical etching of the QW layers may provide an area for exposing contacts, such as N-contacts, for each LED. In some embodiments, the symmetry of the selective etch process may depend on the crystal orientation of the QW layers. For example, more surface imperfections may be present along a second side of the QW layers than along a first side. Thus, etching the second side further in the lateral direction than the first side may more efficiently remove surface defects.

Figure 4A:
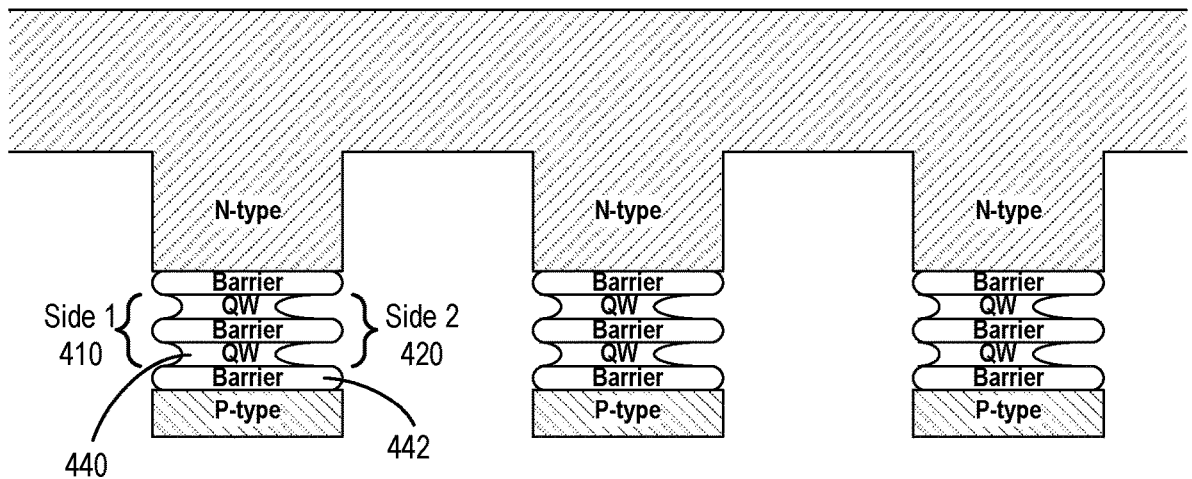
FIG. 4A illustrates a cross-sectional view of a plurality of asymmetrically etched active layers, according to an embodiment of the disclosure.
Figure 4B:
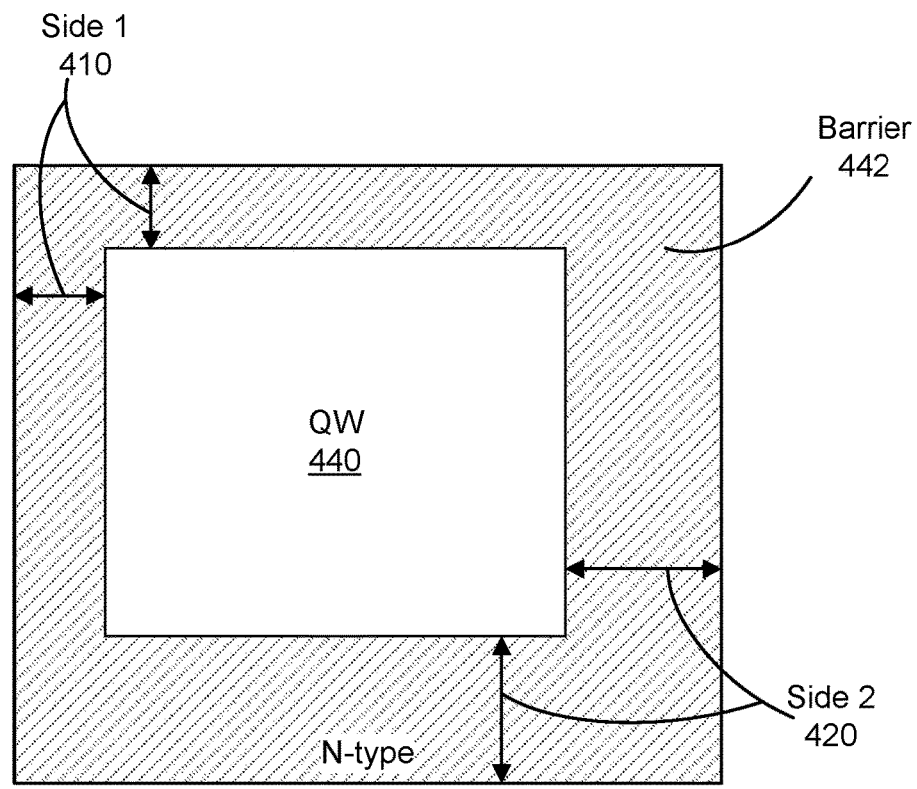
FIG. 4B illustrates a top-down view of an asymmetrically etched quantum well layer, according to an embodiment of the disclosure.

FIGS. 4A and 4B illustrate an exemplary embodiment in which the QW layers have been asymmetrically etched. FIG. 4A illustrates a cross-sectional view of a plurality of vertical mesas having asymmetrical etching of the QW layers. As depicted, asymmetrical etching the QW layers may result in a second side 420 of the QW layers being etched further in the lateral direction than a first side 410. For example, the QW layers on the first side 410 may be etched 100 nm in the lateral direction and the second side 420 may be etched 250 nm in the lateral direction. This results in the second side 420 of the QW layers having a greater degree of undercutting than the first side.

FIG. 4B illustrates a top-down view of one QW layer 440 having the asymmetrical etch from FIG. 4A. As depicted in FIG. 4B, the QW layer 440 is etched more on the second side 420 than on the first side 410, and both sides 410, 420 are etched more than a barrier layer 442. It is evident from FIG. 4B that vertical mesas, including the QW layers and the barrier layers, are 3-dimensional (3-D) and etching of the QW layers may be done in a 3-D manner. Thus, depending on the structure of the vertical mesa and active layers, the first side and the second side, and corresponding etch depths, may vary. For example, as shown in FIG. 4B, the vertical mesa and active layers are rectangular so that the first side etch depth to corresponds to two sides 410 of the QW layer 440 and the second side etch depth corresponds to two sides 420 of the QW layer 440. However, in embodiments where the vertical mesa has a different shape the asymmetrical etching of the first side and the second side of the QW layer may vary accordingly.

Etching the QW layers more in the lateral direction than the barrier layers may provide for confinement of charge carriers in the lateral direction. Confinement in the growth, or epi-direction, is already present due to the QW layers being positioned between a barrier layer and a semiconductor layer. By etching the QW layers laterally confinement may be achieved in both the lateral direction and the growth direction. Confinement may allow for electro-static control within the active layers. Confinement may also reduce light emission from the QW layers in the lateral direction. This may facilitate current channeling and may be used to increase light extraction. For example, if the QW layers are selectively etched in a parabolic mesa then the lateral etching of the QW layers, and subsequent selective regrowth, may result in increased extraction efficiency. After selectively etching the QW layers to create lateral confinement, one or more regrowth layers may be grown over etched active layers to form a confinement barrier in the lateral direction.

After selectively etching the QW layers to remove surface imperfections, one or more regrowth layers may be grown over the etched facets. The one or more regrowth layers may include regrowth semiconductor layers that comprise a wide-bandgap (WBG) semiconductor material and/or a narrow band-bandgap (NGB) semiconductor material. Growth of the regrowth semiconductor layer may be performed using various technique including, for example, molecular beam epitaxy (MBE), metalorganic vapor-phase epitaxy (MOVPE), or physical vapor deposition (PVD), such as pulsed laser deposition (PLD). However, the general strategy of growing a regrowth semiconductor layer as an additional epitaxial layer over etched surfaces of a mesa to reduce surface recombination velocity is not necessarily limited to a particular growth technique such as MBE or MOVPE. The regrowth layers are covered in greater detail with respect to FIGS. 5-12.

Growth of the regrowth semiconductor layers may occur at different rates. Regrowth of the QW layers may occur at a faster rate than the barrier layers. In such cases, the areas of undercut may fill in at a faster rate or at a greater amount than the barrier layers, resulting in the undercut areas being completely filled, partially filled, or overfilled, depending on the different rates of regrowth for the QW layers and the barrier layers. The filling depth of the undercut areas may vary depending on the rate differential for the QW layers versus the barrier layers. For example, if the rate differential between the QW layers and the barrier layers is greater during etching than during regrowth, then the undercut areas may only be partially filled. However, if the rate differential between the QW layers and the barrier layers is greater during regrowth than during etching, then the undercut areas may overfill. In some embodiments, the rate differential during etching may be proportional rate differential during regrowth, resulting in the undercut areas to be completely filled. As part of the regrowth, a wide bandgap barrier may be deposited over the etched areas of the active layers for surface passivation and electro-static control.

Figure 5:
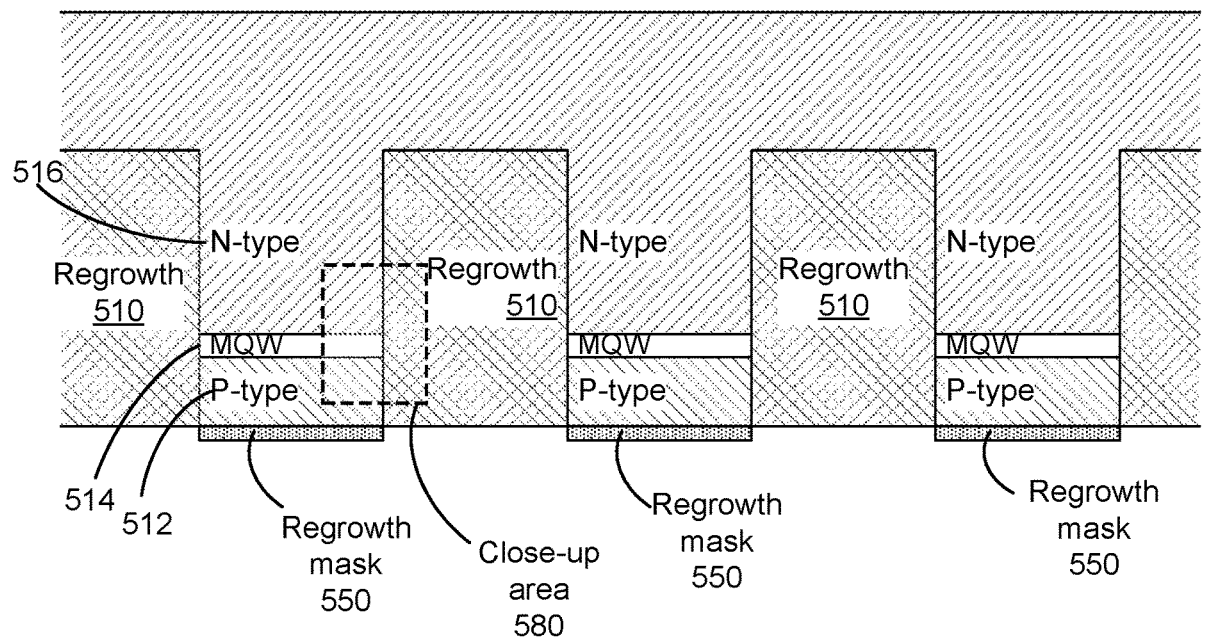
FIG. 5 illustrates a regrowth semiconductor layer grown as an additional epitaxial layer over etched facets of a plurality of mesas, according to an embodiment of the disclosure.

FIG. 5 illustrates a regrowth semiconductor layer 510 grown as an additional epitaxial layer over etched facets of a plurality of mesas, according to an embodiment of the disclosure. In the present embodiment, the regrowth semiconductor layer 510 overlays and is in contact with etched facets of a P-type doped semiconductor layer 512, a quantum well layer (MQW layer 514), and an N-type doped semiconductor layer 516 around an entire perimeter of the mesa. For example, each vertical mesa shown in FIG. 5 may have a generally cylindrical shape. Thus, the regrowth semiconductor layer 510 may fully surround each vertical mesa, such that the perimeter sidewalls of cylindrical shape of each mesa is overlaid with the regrown semiconductor layer. The cross-sectional view presented in FIG. 5 illustrates such an arrangement. In the particular embodiment shown in this figure, the regrowth semiconductor layer completely fills the trenches between adjacent mesas.

Various surface preparation techniques may be used to remove imperfections or otherwise improve the condition of the mesa facet surface for epitaxial regrowth. These surface preparations may include plasma cleaning, thermal desorption in high-vacuum or ultra-high vacuum, Hz, $NH_3$, phosphine, arsine overpressure at high temperature, in-situ $Cl_2$ etch, etc. In the case of MOCVD, surface preparation technique may include, for example, annealing at high temperatures (e.g., at ranges around 900 degrees Celsius). In the case of MBE, surface preparation technique may include, for example, (1) in-situ cleaning using hydrogen $H_2$ gas and/or annealing in ultra-high vacuum (UHV), e.g., at pressures lower than $10^{-7}$ Pascal, and (2) gallium (Ga) flash-off or Ga polish.

In addition to cleaning and removal of materials, the surface may also be reconstructed. For example, pressurized treatment with a Group V material with an extended high temperature step close to the growth temperature of the regrowth material may be used, in order to build an ordered surface. The progress of surface reconstruction may be monitored using in-situ techniques such as reflection high-energy electron diffraction (RHEED) or ellipsometry (SE). A rapid quench step may also be used and/or the temperature may be increased for the subsequent deposition steps.

Regrowth masks may be employed to ensure area-selective growth. As shown in FIG. 5, a regrowth mask 550 may be deposited on top of each mesa (shown on the bottom side of FIG. 5 because the orientation of the mesas is "flipped" in the figure) prior to the regrowth step. While not shown in FIG. 5 and subsequent figures, a P-contact layer may exist on the P-type doped semiconductor layer. The regrowth masks 550 may be deposited over such a P-contact layer (e.g., metal layer). According to various embodiments, the regrowth mask may comprise a material such as $SiO_2$ or $SiN_x$. Regrowth masks ensure that the regrowth semiconductor layer is only grown at selected locations. After one or more regrowth semiconductor layers are established, the regrowth masks 550 may be etched away. Additionally or alternatively, other techniques may be used to remove unwanted or excessive regrowth material from locations where regrowth is not desired. Such removal techniques may include planarization, e.g., chemical mechanical planarization (CMP).

Epitaxial growth of the one or more regrowth semiconductor layers may be designed to take many factors into account. In some cases, the materials may induce local strain at the regrowth interface. In other cases, the initial layers of growth may become diffuse. The one or more regrowth semiconductor layers may be configured for:

energy landscape (e.g. a large bandgap material next to the original crystal)

defect density to reduce non-radiative recombination electrostatic control through doping (induces band bending in original materials to make minority carrier transport into interface traps unlikely.)

lattice matching to original material (e.g., wurtzite on wurtzite or 001 wurtzite on 111 zincblende materials)

environmental sensitivity (e.g. Al free surfaces to prevent oxidation, or finish with Al surfaces and purposefully oxidized in following steps)

According to some embodiments, the one or more regrowth semiconductor layers may comprise a wide-bandgap (WBG) semiconductor material and/or a narrow band-bandgap (NGB) semiconductor material. Here, WBG refers to semiconductor materials which have a relatively large bandgap, e.g., in the range of 2-4 electronvolts (eV). NGB refers semiconductor materials with have a relatively small bandgap, e.g., less than 1.11 eV. Conventional semiconductors such as silicon that have a bandgap in the range of 1-1.5 eV. In some embodiments, the bandgap of a regrowth semiconductor layer is wider than that of a QW layer in order to prevent light absorption and confine charge carriers to the quantum well. In some embodiments, the regrowth semiconductor layer may comprise an undoped semiconductor material. In other embodiments, the regrowth semiconductor layer may comprise a doped semiconductor material. The regrowth semiconductor layer may also comprise a "lightly doped" semiconductor material. For example, the regrowth semiconductor layer may have a dopant concentration that is significantly lower than that of the N-type doped semiconductor layer (or P-type doped semiconductor layer). In various embodiments, the regrowth semiconductor layer may comprise a material selected from: aluminum nitride (AlN), aluminum gallium Nitride (AlGaN), aluminum gallium arsenide (AlGaAs), aluminum indium phosphide (AlInP), zinc oxide (ZnO), aluminum gallium indium phosphide (AlGaInP), gallium phosphide (GaP), aluminum phosphide (AlP), aluminum gallium phosphide (AlGaP), or indium gallium phosphide (InGaP).

According to various embodiments of the disclosure, the material of regrowth semiconductor layer may be selected to match or resemble the material of the N-type doped semiconductor layer and/or P-type doped semiconductor layer of the LED, such that a "perfect" or near perfect crystalline interface is achieved. Similar materials allow for a consistent lattice structure to be continued over the interface between the regrowth semiconductor layer and the N-type doped semiconductor layer (or the interface between the regrown semiconductor layer and the P-type doped semiconductor layer) of the etched mesa structure. Such an interface minimizes the occurrence of dangling bonds, to effectively reduce surface recombination velocity (SRV). For instance, if the N-type doped semiconductor layer and P-type doped semiconductor layer comprise III-V semiconductor materials, the regrowth semiconductor layer may also comprise III-V semiconductor materials.

Growth conditions for the one or more regrowth semiconductor layers may be different than the growth conditions for the N-type doped semiconductor layer and P-type doped semiconductor layer of the etched mesa structure of the LED. The N-type doped semiconductor layer and P-type doped semiconductor layer of the LED are grown in an upward direction from the substrate layer (e.g., substrate layer 110 in FIG. 1). By contrast, the regrowth semiconductor layer is mainly grown in a lateral direction, outward from the facets of the mesa structure. Thus, growth conditions for the regrowth semiconductor layer may be optimized to increase lateral growth rate, as opposed to an upwards growth rate with respect to the substrate layer. Optimizing for lateral growth rate may be accomplished by controlling factors such as the molecular composition of the regrowth semiconductor layer, e.g., the ratio of Group III to Group V elements in the material ("III/V ratio"), the temperature at which regrowth occurs, and by aligning offcut to the growth plane.

For example, materials chosen for the one or more regrowth semiconductor layers may include Group III-AsP or Group III-N materials, including AlInGaP, AlInGaP(As), AlInGaPN, AlInGaN, (B)AlInGaN. These materials may also be doped using additives such as Si, Mg, C, Te, etc. In other examples, materials chosen for the one or more regrowth semiconductor layers may include Group II-VI materials such as ZnS and ZnO. The materials may be deposited with growth conditions that may be different from typical growth plane growth conditions, in order to:
1. change the relative growth rate on the exposed facets compared to the original facet of the material
2. improve the quality of the material
3. build heterostructures with controlled thickness As an example, GaN may normally be grown with high $NH_3$ partial pressures in MOCVD in order to promote lateral growth and suppress growth in the 001 direction to obtain smooth films ($NH_3$ being gaseous ammonia that acts as a precursor to provide nitrogen for forming, for example, a Group III-nitride such as GaN). However, according to an embodiment of the present disclosure, the regrowth layers/films may instead be grown with substantially lower $NH_3$ partial pressures, in order to obtain smooth films on the sidewalls of a device (e.g., LED device) or suppress bridging when growing inside trenches with high aspect ratios. Examples of such trenches may be the voids between LEDs shown in FIGS. 2A and 2B.

Figure 6:
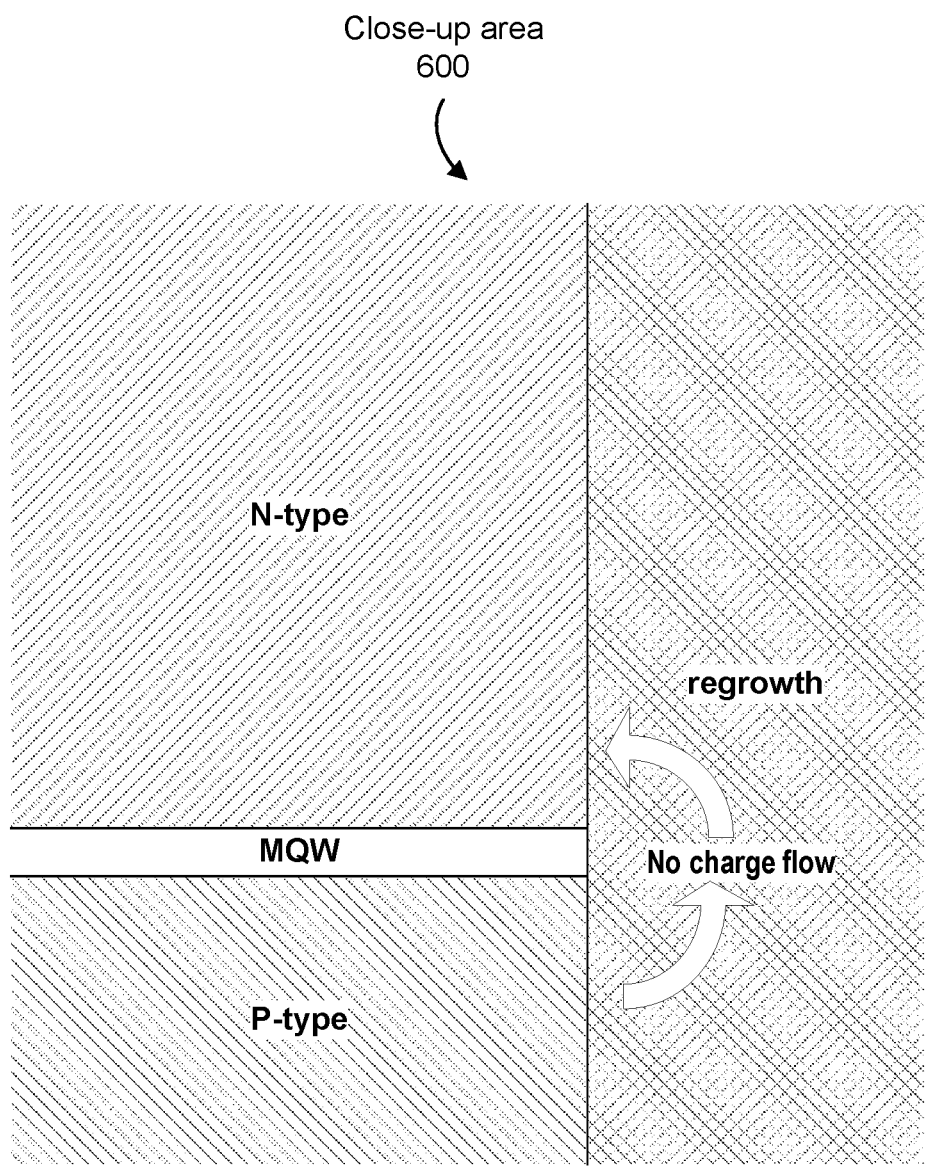
FIG. 6 depicts a close up area at a juncture of an N-type doped semiconductor material, a multiple quantum wells layer, a P-type doped semiconductor material, and a regrowth layer.

FIG. 6 depicts a close-up area 600 at a juncture of an N-type doped semiconductor material, a multiple quantum wells layer, a P-type doped semiconductor material, and a regrowth layer. The close-up area 600 may be, for example, a magnified version of the close-up area 580 depicted in FIG. 5. According to an embodiment, the regrown layer may comprise a doped semiconductor material. Here, the regrowth semiconductor layer may be doped to attain a Fermi level associated with the regrowth semiconductor layer acting as an insulator that prevents shorting out of the LED—i.e., preventing shorting caused by charge flow between the P-doped semiconductor layer and the N-doped semiconductor layer through the regrowth semiconductor layer.

For example, referring again to FIG. 6, if an N-type doped semiconductor is used for the regrowth semiconductor layer, then the structure shown in FIG. 6 may have a first p-n junction and potentially a second p-n junction. The first p-n junction is a vertical junction formed by the combination of the P-type doped semiconductor layer, the MQW layer, and the N-type doped semiconductor. More generally, a vertical junction can include any junction formed by a quantum well layer in combination with a pair of oppositely doped semiconductor layers. The second p-n junction is a lateral junction potentially formed by the combination of the P-type doped semiconductor layer and the regrowth semiconductor layer which, in this example, comprises an N-type doped semiconductor. More generally, a lateral junction can include any junction formed by a regrowth semiconductor layer in combination with a semiconductor layer of opposite doping. However, materials and doping levels may be chosen for the various layers, thus controlling the respective Fermi levels, such that the turn-on voltage of the first p-n junction is significantly lower than the turn-on voltage of the second p-n junction. In the presence of charge potential, the first p-n junction would turn on, whereas the second p-n junction would not. That is, charges would flow with respect to the first p-n junction but not flow with respect to the second p-n junction. Thus, the regrowth semiconductor layer would act as an insulator that prevents shorting of the LED by virtue of forming a path that is less conducive to charge flow (i.e., the path through the lateral junction) compared to the path connecting the P-type doped semiconductor to the N-type doped semiconductor (i.e., the path through the vertical junction).

Figure 7:
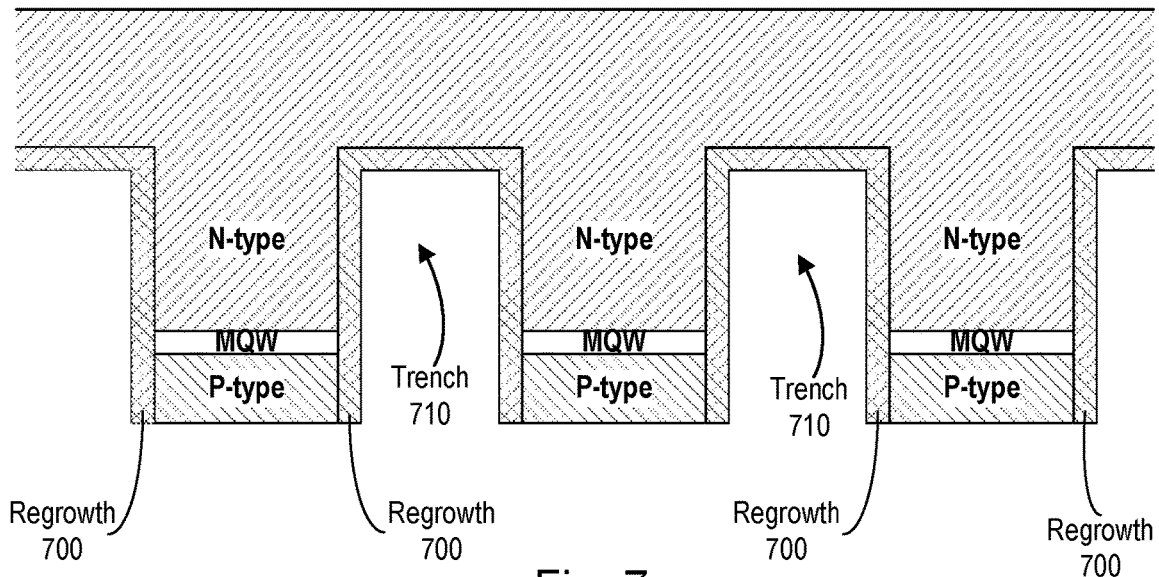
FIG. 7 illustrates a regrowth semiconductor layer partially filling trenches between adjacent mesas, according to an embodiment of the disclosure.

FIG. 7 illustrates a regrowth semiconductor layer 700 partially filling trenches between adjacent mesas, according to an embodiment of the disclosure. Here, while the trenches 710 between adjacent mesas are only partially filled, the regrowth semiconductor layer nevertheless effectively passivates the exposed facets of the mesa structure. Once again, similar materials may be used to allow for a consistent lattice structure to be continued over the interface between the regrowth semiconductor layer and the N-type doped semiconductor layer (or the interface between the regrown semiconductor layer and the P-type doped semiconductor layer) of the etched mesa structure. This significantly reduces the occurrence of dangling bonds at the mesa facet, especially near the MQW layer, thus mitigating the detrimental effects of surface recombination.

The choice between completely filling and partially filling the trenches between adjacent mesas may involve balancing the feasibility versus the performance gains associated with each approach. Factors that impact the feasibility and performance gains of the respective approaches include the pitch (i.e., center-to-center distance between adjacent mesas) and shape of the mesas.

Figure 8:
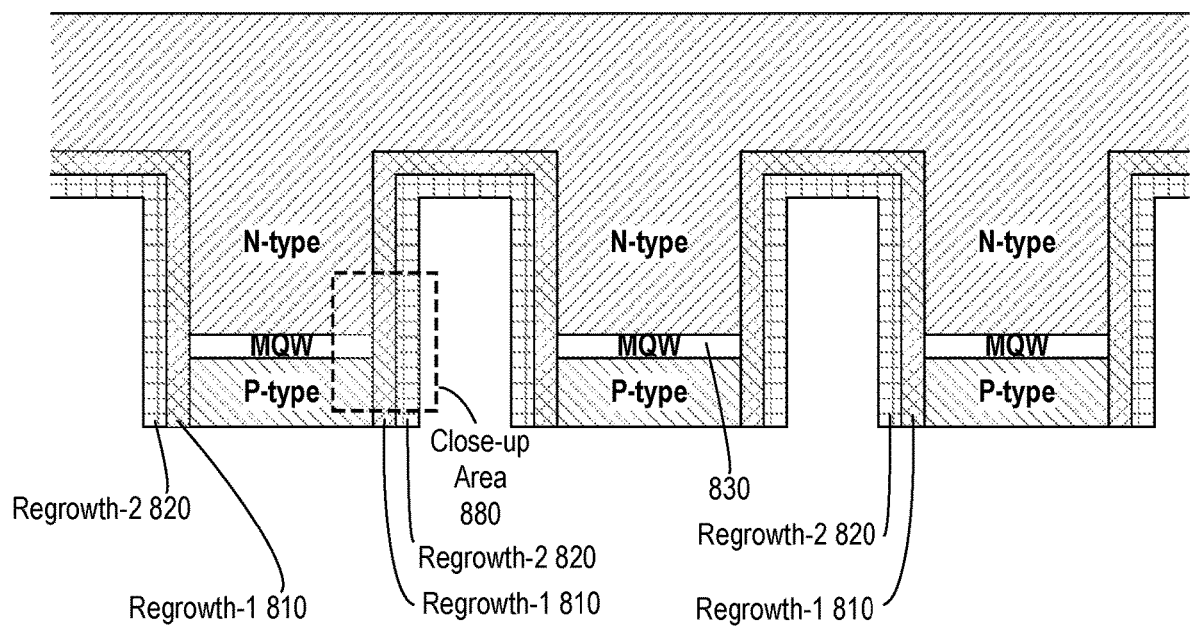
FIG. 8 illustrates a second regrowth semiconductor layer grown as a further epitaxial layer over a first regrowth semiconductor layer, according to an embodiment of the disclosure.

FIG. 8 illustrates a second regrowth semiconductor layer 820 grown as a further epitaxial layer over a first regrowth semiconductor layer 810, according to an embodiment of the disclosure. Thus, a heterogeneous regrowth structure may be achieved by employing two or more different regrowth semiconductor layers. This may be referred to as a "heterostructure" variant of the regrowth semiconductor structure. The multiple regrowth semiconductor layers may comprise different materials. Just as an example, referring to FIG. 8, the first regrowth semiconductor layer 810 may comprise a wide-bandgap (WBG) material, and the second regrowth semiconductor layer 820 may comprise a narrow-bandgap (NBG) material. Although the NBG material makes the bandgap of the second regrowth semiconductor layer 820 narrower than the bandgap of the first regrowth semiconductor layer 810, the second regrowth semiconductor layer 820 can nevertheless still have a wider bandgap than an MQW layer 830, more specifically, a quantum well within the MQW layer 830. In this example, the WBG material may provide an insulating function to prevent the regrowth semiconductor layers from serving as a conduit for the movement of charges between the P-type doped semiconductor layer and the N-type doped semiconductor layer of the LED. The WBG material may further provide a passivation function to avoid dangling bonds at the mesa facet by reducing the occurrence of unpaired valence electrons at facets of quantum well layers exposed prior to formation of the regrowth semiconductor layers (e.g., exposed facets of the MQW layer as a result of using the selective etching process shown in FIGS. 3A and 3B), thus significantly reducing surface recombination velocity.

According to certain embodiments, the WBG material of the first regrowth semiconductor layer may be undoped, P-type doped, or N-type doped. The NBG material of the second regrowth semiconductor layer may be undoped, P-type doped, N-type doped, or doped such that the material is at or near a mid-gap state (for example, within plus or minus 0.2 eV of the mid-gap energy level). That is, by carefully controlling the Fermi level, even the NBG material may be designed to act as an insulator. Various combinations of such materials are possible. Some examples of such combinations are listed below.

| LED | 1st regrowth layer (Wide bandgap) | 2nd regrowth (Narrow bandgap) |
|---|---|---|
| Doped | Undoped | Undoped |
| Doped | Undoped | P |
| Doped | Undoped | N |
| Doped | Undoped | Mid-gap state (insulator) |
| Doped | P | Undoped |
| Doped | P | P |
| Doped | P | N |
| Doped | N | Undoped |
|  | N | P |
|  | N | N |

As shown in the table above, in a first specific embodiment, the first regrowth semiconductor layer comprises a WBG material that is undoped, and the second regrowth semiconductor layer comprises an NBG material that is at or near the mid-gap state. In a second specific embodiment, the first regrowth semiconductor layer comprises a WBG material that is undoped, and the second regrowth semiconductor layer comprises an NBG material that is P-type doped. In a third specific embodiment, the first regrowth semiconductor layer comprises a WBG material that is undoped, and the second regrowth semiconductor layer comprises an NBG material that is N-type doped.

An example of a heterostructure may be formed by depositing an environmentally sensitive un-doped WBG material first, followed by an NBG, less environmentally sensitive doped material as an electrostatic control layer. In a specific embodiment, 10-100 nm of aluminum arsenide (AlAs) may be deposited first, followed by 10-100 nm of gallium arsenide (GaAs) doped with silicon (Si).

Additionally, various technique may be adopted to implement the multiple regrowth semiconductor layers. One such technique is delta doping. Delta doping involves the use of thin layers of high dopant concentration in the growth process, to achieve doping profiles that resemble delta functions. Delta doping may be achieved through growth-interrupted impurity deposition during molecular-beam epitaxy (MBE), for example.

Figure 9:
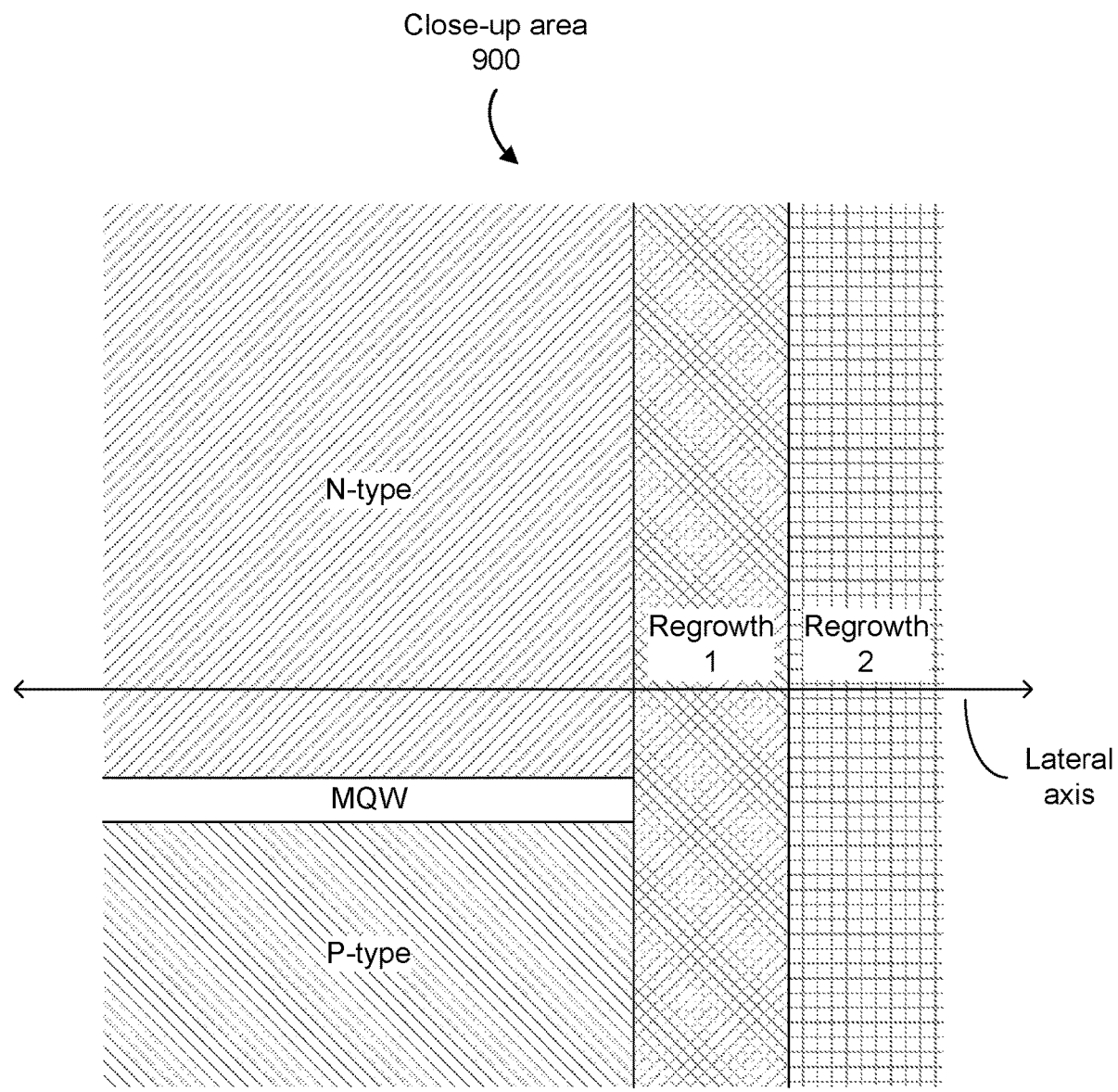
FIG. 9 depicts a close-up area at a juncture of an N-type doped semiconductor material, a multiple quantum wells layer, and a P-type doped semiconductor material of an LED, as well as a first regrowth layer and a second regrowth layer grown over facets of the LED.

FIG. 9 depicts a close-up area 900 at a juncture of an N-type doped semiconductor material, a multiple quantum wells layer, and a P-type doped semiconductor material of an LED, as well as a first regrowth layer and a second regrowth layer grown over facets of the LED. The close-up area 900 may be, for example, a magnified version of the close-up area 880 depicted in FIG. 8. A lateral axis, or "cut line" may be envisioned as cutting across the N-type doped semiconductor layer (or P-type doped semiconductor layer) of the LED, the first regrowth layer, and the second regrowth layer.

Figure 10:
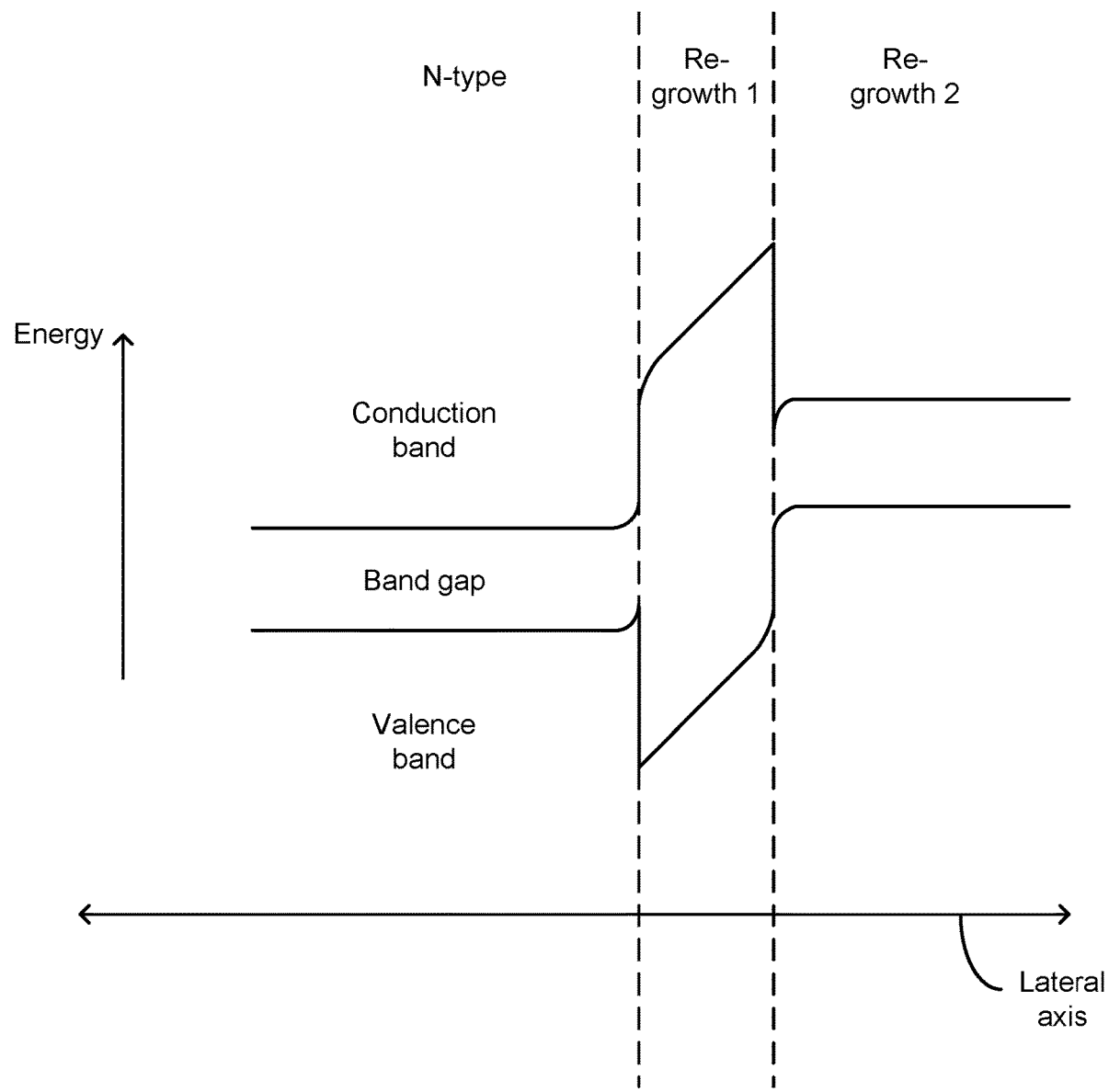
FIG. 10 is a band diagram along a lateral axis of the semiconductor structure shown in FIG. 9.

FIG. 10 is a band diagram of the semiconductor structure shown in FIG. 9. Here, the x-axis is the same lateral axis shown in FIG. 9 that cuts across different materials, such as the N-type doped semiconductor (or P-type doped semiconductor layer) of the LED, the first regrowth semiconductor layer, and the second regrowth semiconductor layer. The y-axis is the magnitude of the energy of an electron. As shown, the N-type doped semiconductor layer of the LED may comprise a narrow-bandgap (NBG) material, characterized by a narrow gap between the lower boundary of the conduction band and the upper boundary of the valence band of the material. By contrast, and in accordance with an embodiment of the disclosure, the first regrowth semiconductor layer may comprise a wide-bandgap (WBG) material, characterized by a wide gap between the lower boundary of the conduction band and the upper boundary of the valence band of the material. Furthermore, according to an embodiment of the disclosure, the second regrowth semiconductor layer may comprise an NBG material, again characterized by a narrow gap between the lower boundary of the conduction band and the upper boundary of the valence band of the material.

According to various embodiments of the disclosure, the choice of the materials used for the different layers allows for electrostatic control to be achieved for the overall structure. In particular, the curvatures of the lower boundary of the conduction band and upper boundary of the valence band near the interfaces between adjacent materials may be controlled through the selection of the various materials.

Figure 11:
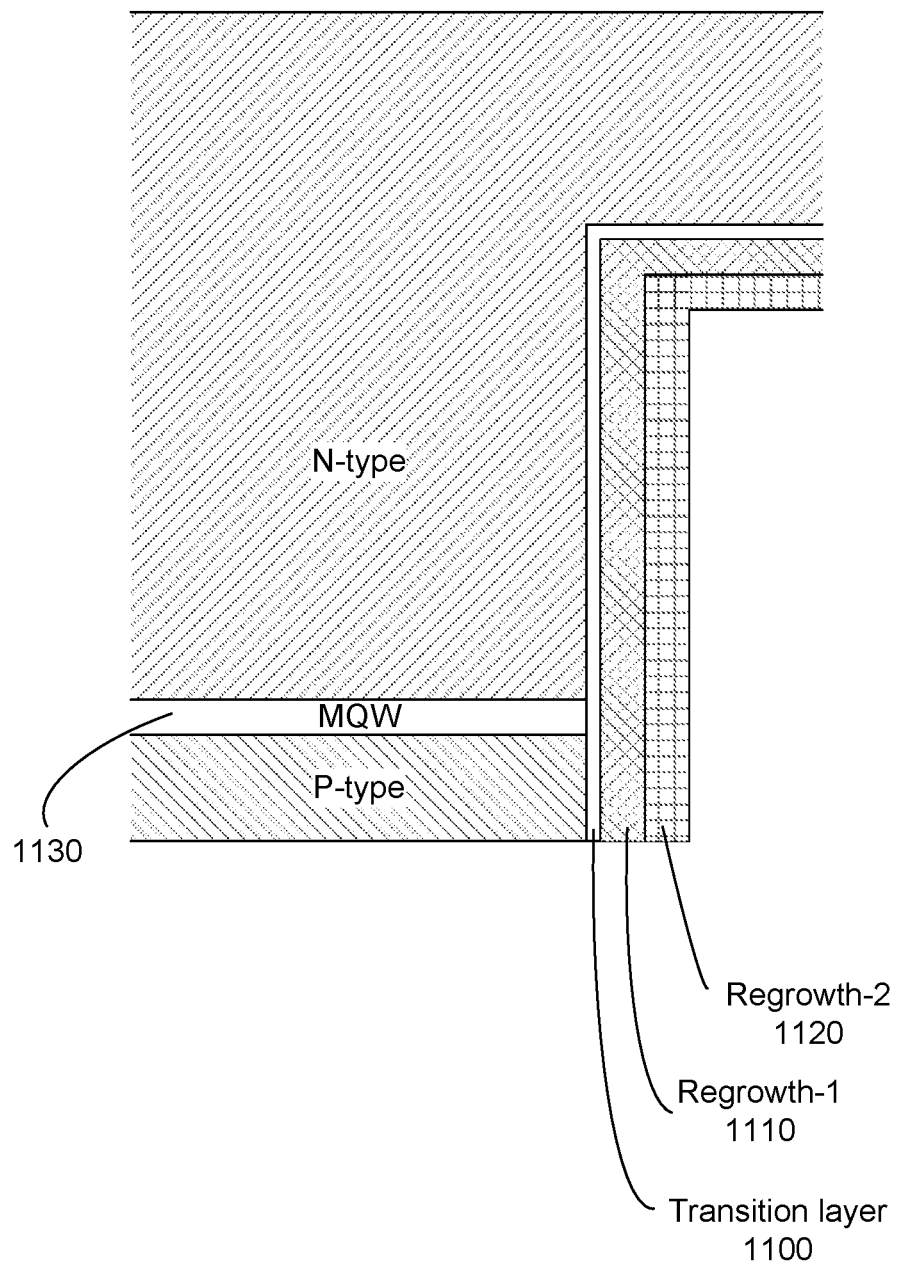
FIG. 11 illustrates a transition layer grown on a mesa facet to provide a smooth film before a first regrowth semiconductor layer is grown, according to embodiments of the disclosure.

FIG. 11 illustrates a transition layer 1100 grown on a mesa facet to provide a smooth film before a first regrowth semiconductor layer 1110 is grown, according to embodiments of the disclosure. The transition layer 1100 may also be considered one of the regrowth layers and can therefore be formed of any of the regrowth materials discussed above. Thus, in FIG. 11, the one or more regrowth semiconductor layers include the transition layer 1100, the first regrowth semiconductor layer 1110, and a second regrowth semiconductor layer 1120. In certain instances, the material chosen for the first regrowth semiconductor layer 1110 may be characterized by low mobility. For example, the first regrowth semiconductor layer 1110 may comprise a material containing aluminum (Al), characterized by low mobility. That is, molecules of the material cannot travel very far once deposited and therefore cannot move to locations such as craters, etc., to fill depressions and even out unsmooth surfaces. As a result, unevenness, i.e., undesirable surface features, tend to be repeated as a layer of the immobile regrowth material is deposited. To address this issue, a transition layer having relatively high mobility may be deposited on the mesa facet, to provide a smooth surface on which the first regrowth semiconductor material may be grown. According to one embodiment, the transition layer 1100 may comprise a moderately narrow-bandgap material (e.g., wider than an MQW layer 1130, but narrower than the first regrowth semiconductor layer 1110).

FIG. 11 is one example of a transition layer. In another embodiment, a transition layer can be located between regrowth semiconductor layers. In such an embodiment, the first regrowth semiconductor layer may comprise a wide-bandgap (WBG) material, the second regrowth semiconductor layer may comprise a narrow-bandgap (NBG) material, and the transition layer may comprise a material having a moderately narrow bandgap that is narrower than the WBG material of the first regrowth semiconductor layer, but wider than the NBG material of the second regrowth semiconductor layer. For example, the first regrowth semiconductor layer may comprise aluminum gallium nitride ($Al_xGa_{1-x}N$), the second regrowth semiconductor layer may comprise gallium nitride (GaN), and the transition layer may comprise aluminum indium gallium nitride (AlInGaN). In this example, the transition layer may be particularly useful when the aluminum (Al) content of the first regrowth layer is greater than a particular threshold, e.g., when [AlN]>0.2 (that is, when x>0.2).

Figure 12:
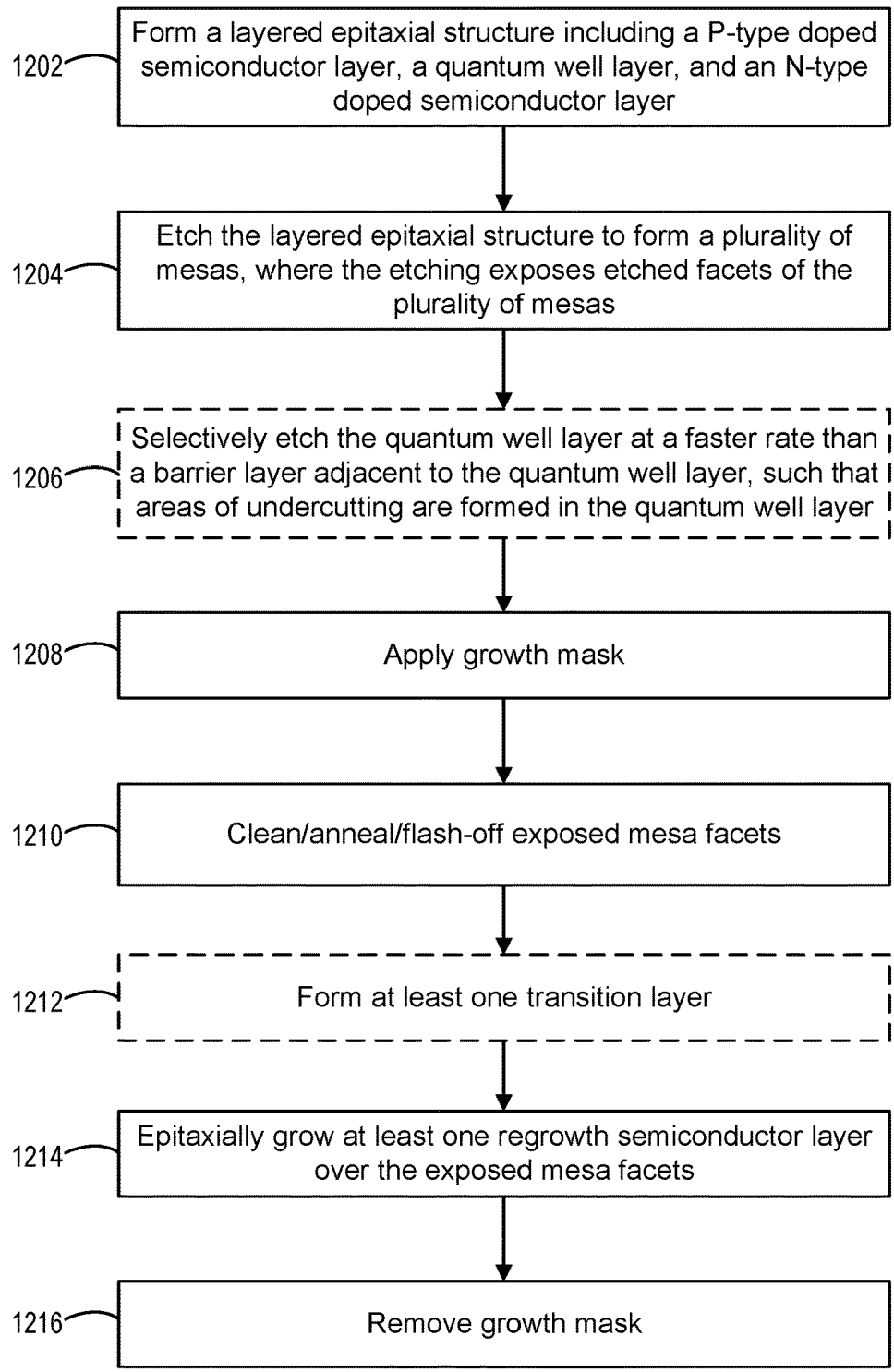
FIG. 12 is a flow chart presenting illustrative steps for regrowing epitaxial layer(s) over etched facets of a mesa configured as an LED, according to various embodiments of the disclosure.

FIG. 12 is a flow chart 1200 presenting illustrative steps for regrowing epitaxial layer(s) over etched facets of a mesa configured as an LED, according to various embodiments of the disclosure. The functionality depicted in FIG. 12 can be performed using semiconductor device manufacturing equipment and processes, with at least some of the processes performed in an automated fashion by a computer.

At block 1202, a layered epitaxial structure is formed on a substrate. The layered epitaxial structure may include a P-type doped semiconductor layer, a quantum well layer, and an N-type doped semiconductor layer, each of which can be epitaxially grown on the substrate, one layer at a time. In some embodiments, the layered epitaxial structure can include a multiple quantum wells (MQW) layer with multiple quantum wells. Each quantum well can correspond to a sub-layer within the MQW layer. Further, as discussed above, quantum wells can be formed adjacent to barriers with successive layers alternating between quantum well layers and barrier layers, as shown in the example of FIGS. 3A and 3B. Additional layers may also be formed as part of the layered epitaxial structure in 1202. For instance, a conductive layer such as a P-metal layer may be formed on top of the P-type doped semiconductor layer.

At block 1204, the layered epitaxial structure formed in 1202 is etched (e.g., chemically) to form a plurality of mesas. The etching may, for example, produce a one-dimensional or two-dimensional array of mesas, with adjacent mesas being separated by trenches. Further, the etching exposes etched facets of the plurality of mesas. As discussed above, the etched facets at this stage of the LED manufacturing process can include surface imperfections characterized by atoms with unpaired valence electrons, especially at exposed facets of a quantum well layer. To reduce the occurrence of unpaired electrons at exposed facets, further etching may optionally be performed at block 1206.

At block 1206, the quantum well layer of the layered epitaxial structure is, optionally, selectively etched at a faster rate than a barrier layer adjacent to the quantum well layer. As discussed above in connection with the example of FIGS. 3A and 3B, this selective etching can form areas of undercutting in the quantum well layer, thereby exposing facets of the quantum well layer that have fewer unbonded valence electrons.

At block 1208, a growth mask is applied in preparation for growing one or more regrowth semiconductor layers. The growth mask can, for example, be a reusable mask or a mask that is chemically dissolvable and may correspond to the regrowth masks 550 in FIG. 5. The regrowth mask can be applied onto a surface of the topmost layer of the layered epitaxial structure (e.g., on top of a conductive layer).

At block 1210, various steps for cleaning, annealing, and flash-off may be performed on the exposed mesa facets. These steps help to prepare the surfaces of the exposed mesa facets (e.g., exposed facets of the P-type doped semiconductor layer, the N-type doped semiconductor layer, and the quantum well layer) for epitaxial regrowth. Examples of such surface preparation steps are described above in connection with FIG. 5.

At block 1212, at least one transition layer is optionally formed. The transition layer(s) can be epitaxially grown in a similar manner as the regrowth semiconductor layer(s) formed in block 1214 (discussed below) and can be located between a mesa facet and a regrowth semiconductor layer and/or between regrowth semiconductor layers, as discussed above in connection with FIG. 11. A transition layer between a mesa facet and a regrowth semiconductor layer can provide a smooth surface (e.g., by evening out the comparatively rougher surface of the mesa facet) in preparation for growing the regrowth semiconductor layer. Accordingly, the processing in block 1214 can, in some instances, be performed prior to the processing in block 1212. A transition layer between regrowth semiconductor layers can act as intermediate bandgap layer to provide a less abrupt energy level transition from one regrowth semiconductor layer to another.

At block 1214, at least one regrowth semiconductor layer is epitaxially grown over the exposed mesa facets, i.e., the facets that are exposed as a result of the processing in block 1204 or 1206. For example, a first regrowth semiconductor layer can be formed followed by the optional transition layer in block 1212, then a second regrowth semiconductor layer so that the second regrowth semiconductor layer is formed over the first regrowth semiconductor layer, but with the transition layer as an intervening layer. As discussed above, regrowth layers can operate to further reduce unpaired valence electrons and, depending on the bandgap configuration of the regrowth layers, may also act as insulators that confine charge carriers to the quantum well layer(s).

At block 1216, the regrowth mask applied in block 1208 is removed, e.g., in a separate etch process. In this manner, the same mask can be used to form all of the regrowth semiconductor layers and, optionally, one or more transition layers.

What is claimed is:

1. A light emitting diode (LED) array apparatus comprising:
    a plurality of mesas etched from a layered epitaxial structure, wherein the layered epitaxial structure comprises:
        a quantum well layer etched according to a first etch rate; and
        a barrier layer etched according to a second etch rate, the barrier layer positioned adjacent to the quantum well layer,
        wherein the first etch rate is greater than the second etch rate such that along etched facets of the plurality of mesas, areas of undercutting are formed in the quantum well layer as a result of etching to a greater depth compared to the barrier layer; and
    one or more regrowth semiconductor layers, including a first regrowth semiconductor layer, grown epitaxially over the etched facets of the plurality of mesas, wherein for each mesa, the first regrowth semiconductor layer overlays the quantum well layer and the barrier layer.

2. The LED array apparatus of claim 1, wherein the barrier layer comprises a material selected from: gallium nitride (GaN), aluminum gallium nitride (AlGaN), indium gallium nitride (InGaN), aluminum gallium indium nitride (AlGaInN), aluminum indium gallium phosphide (AlInGaP), aluminum indium phosphide (AlInP), aluminum gallium arsenide (AlGaAs), or aluminum indium gallium arsenide phosphide (AlInGaAsP).

3. The LED array apparatus of claim 1, wherein the quantum well layer comprises a material selected from: indium gallium nitride (InGaN), aluminum indium gallium phosphide (AlInGaP), indium gallium phosphide (InGaP), gallium arsenide phosphide (GaAsP), or gallium nitride (GaN).

4. The LED array apparatus of claim 1, where the layered epitaxial structure comprises 1 to 10 quantum well layers in total and 1 to 10 barrier layers in total, with successive layers alternating between quantum well layers and barrier layers.

5. The LED array apparatus of claim 1, wherein the one or more regrowth semiconductor layers at least partially fill the areas of undercutting.

6. The LED array apparatus of claim 1, further comprising:
voids between adjacent mesas of the plurality of mesas, wherein the one or more regrowth semiconductor layers partially fill the voids.

7. The LED array apparatus of claim 1, wherein the first regrowth semiconductor layer has a wider bandgap than the quantum well layer.

8. The LED array apparatus of claim 1, wherein the one or more regrowth semiconductor layers further include a second regrowth semiconductor layer formed over the first regrowth semiconductor layer.

9. The LED array apparatus of claim 8, wherein the second regrowth semiconductor layer has a narrower bandgap than the first regrowth semiconductor layer.

10. A light emitting diode (LED) array apparatus comprising:
a plurality of mesas etched from a layered epitaxial structure, wherein the layered epitaxial structure comprises a P-type doped semiconductor layer, a quantum well layer, and an N-type doped semiconductor layer; and
one or more regrowth semiconductor layers, including a first regrowth semiconductor layer, grown epitaxially over etched facets of the plurality of mesas,
wherein:
for each mesa, the first regrowth semiconductor layer overlays the P-type doped semiconductor layer, the quantum well layer, and the N-type doped semiconductor layer, around an entire perimeter of the mesa,
the one or more regrowth semiconductor layers further include a second regrowth semiconductor layer formed over the first regrowth semiconductor layer, and
the second regrowth semiconductor layer has a narrower bandgap than the first regrowth semiconductor layer.

11. The LED array apparatus of claim 10, wherein the one or more regrowth semiconductor layers completely fill voids between adjacent mesas of the plurality of mesas.

12. The LED array apparatus of claim 10, wherein the one or more regrowth semiconductor layers partially fill voids between adjacent mesas of the plurality of mesas.

13. The LED array apparatus of claim 10, wherein the first regrowth semiconductor layer is doped to attain a Fermi level such that a lateral junction formed by the first regrowth semiconductor layer is less conducive to charge flow than a vertical junction formed by the quantum well layer.

14. The LED array apparatus of claim 10, wherein the first regrowth semiconductor layer comprises a material selected from: aluminum nitride (AlN), aluminum gallium nitride (AlGaN), aluminum gallium arsenide (AlGaAs), aluminum indium phosphide (AlInP), zinc oxide (ZnO), aluminum gallium indium phosphide (AlGaInP), gallium phosphide (GaP), aluminum phosphide (AlP), aluminum gallium phosphide (AlGaP), or indium gallium phosphide (InGaP).

15. The LED array apparatus of claim 10, wherein the first regrowth semiconductor layer is undoped, and wherein the second regrowth semiconductor layer is doped to a level sufficient to achieve a Fermi-level this is at or near mid-gap state.

16. The LED array apparatus of claim 10, wherein the first regrowth semiconductor layer is undoped, and wherein the second regrowth semiconductor layer is P-type doped or N-type doped.

17. The LED array apparatus of claim 10, wherein the one or more regrowth semiconductor layers further include a transition layer between the first regrowth semiconductor layer and etched facets of the P-type doped semiconductor layer, the quantum well layer, and the N-type doped semiconductor layer, and wherein the transition layer forms a smooth surface on which the first regrowth semiconductor layer is grown.

18. The LED array apparatus of claim 10, wherein the one or more regrowth semiconductor layers further include a transition layer between the first regrowth semiconductor layer and the second regrowth semiconductor layer, and wherein the transition layer has a bandgap that is narrower than that of the first regrowth semiconductor layer and wider than that of the second regrowth semiconductor layer.

19. A method for forming a light emitting diode (LED) array, the method comprising:
forming a layered epitaxial structure, wherein the layered epitaxial structure comprises a P-type doped semiconductor layer, a quantum well layer, a barrier layer adjacent to the quantum well layer, and an N-type doped semiconductor layer;
etching the layered epitaxial structure to form a plurality of mesas, wherein the etching exposes etched facets of the plurality of mesas and involves etching the quantum well layer at a faster rate than the barrier layer such that areas of undercutting are formed in the quantum well layer; and
epitaxially growing one or more regrowth semiconductor layers, including a first regrowth semiconductor layer, over the etched facets of the plurality of mesas, wherein for each mesa, the first regrowth semiconductor layer overlays the P-type doped semiconductor layer, the quantum well layer, and the N-type doped semiconductor layer, around an entire perimeter of the mesa.

20. The method of claim 19, wherein epitaxially growing the one or more regrowth semiconductor layers comprises performing epitaxial growth until the one or more regrowth semiconductor layers completely fill voids between adjacent mesas of the plurality of mesas.

21. The method of claim 19, wherein epitaxially growing the one or more regrowth semiconductor layers comprises ending epitaxial growth before the one or more regrowth semiconductor layers can completely fill voids between adjacent mesas of the plurality of mesas.

22. The method of claim 19, further comprising:
doping the first regrowth semiconductor layer to attain a Fermi level such that a lateral junction formed by the first regrowth semiconductor layer is less conducive to charge flow than a vertical junction formed by the quantum well layer.

23. The method of claim 19, wherein the first regrowth semiconductor layer comprises a material selected from: aluminum nitride (AlN), aluminum gallium nitride (AlGaN), aluminum gallium arsenide (AlGaAs), aluminum indium phosphide (AlInP), zinc oxide (ZnO), aluminum gallium indium phosphide (AlGaInP), gallium phosphide (GaP), aluminum phosphide (AlP), aluminum gallium phosphide (AlGaP), or indium gallium phosphide (InGaP).

24. The method of claim 19, wherein epitaxially growing the one or more regrowth semiconductor layers comprises:
growing a second regrowth semiconductor layer over the first regrowth semiconductor layer, wherein the second regrowth semiconductor layer has a narrower bandgap than the first regrowth semiconductor layer.

25. The method of claim 24, further comprising:
doping the second regrowth semiconductor layer to a level sufficient to achieve a Fermi-level at or near mid-gap state, wherein the first regrowth semiconductor layer is left undoped.

26. The method of claim 24, wherein epitaxially growing the one or more regrowth semiconductor layers comprises:
forming a transition layer between the first regrowth semiconductor layer and the etched facets of the P-type doped semiconductor layer, the quantum well layer, and the N-type doped semiconductor layer, wherein the transition layer forms a smooth surface on which the first regrowth semiconductor layer is grown.

27. The method of claim 24, further comprising:
forming a transition layer between the first regrowth semiconductor layer and the second regrowth semiconductor layer, wherein the transition layer has a bandgap that is narrower than that of the first regrowth semiconductor layer and wider than that of the second regrowth semiconductor layer.

28. The method of claim 19, wherein the etching of the layered epitaxial structure to form the plurality of mesas comprises:
forming the plurality of mesas as vertical mesas; and
using a selective etching process on the vertical mesas to etch the quantum well layer and the barrier layer.

29. The method of claim 19, wherein the etching of the quantum well layer reduces an occurrence of unpaired valence electrons at facets of the quantum well layer that are exposed prior to formation of the areas of undercutting.

30. The method of claim 29, wherein epitaxially growing the one or more regrowth semiconductor layers comprises:
performing epitaxial growth until the one or more regrowth semiconductor layers at least partially fill the areas of undercutting, thereby reducing an occurrence of unpaired valence electrons at facets of the quantum well layer that are exposed as a result of forming the areas of undercutting.

* * * * *